US009018621B2

(12) United States Patent
Park et al.

(10) Patent No.: US 9,018,621 B2
(45) Date of Patent: Apr. 28, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Sung-Hee Park, Goyang-si (KR); Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/107,679

(22) Filed: Dec. 16, 2013

(65) Prior Publication Data

US 2014/0312323 A1 Oct. 23, 2014

(30) Foreign Application Priority Data

Apr. 23, 2013 (KR) .................. 10-2013-0044924

(51) Int. Cl.
H01L 51/05 (2006.01)
B82Y 10/00 (2011.01)
H01L 27/32 (2006.01)
H01L 51/52 (2006.01)

(52) U.S. Cl.
CPC .......... *H01L 27/3246* (2013.01); *H01L 51/525* (2013.01); *H01L 27/3279* (2013.01); *H01L 2227/323* (2013.01)

(58) Field of Classification Search
CPC ............ H01L 51/0545; H01L 51/0036; H01L 51/0541; H01L 51/5012; B82Y 10/00
USPC .......................................... 257/40; 438/82, 99
See application file for complete search history.

(56) References Cited

U.S. PATENT DOCUMENTS

| 2003/0227021 | A1* | 12/2003 | Yamazaki et al. | ............... 257/83 |
| 2008/0090014 | A1* | 4/2008 | Yan | ................................ 427/404 |
| 2011/0207244 | A1* | 8/2011 | Sung et al. | ......................... 438/7 |
| 2011/0278615 | A1* | 11/2011 | No et al. | .......................... 257/98 |
| 2012/0235147 | A1* | 9/2012 | Park et al. | ......................... 257/59 |
| 2013/0056784 | A1* | 3/2013 | Lee et al. | ......................... 257/99 |

FOREIGN PATENT DOCUMENTS

KR    10-2011-0100956    9/2011

* cited by examiner

*Primary Examiner* — Steven Loke
*Assistant Examiner* — Didarul Mazumder
(74) *Attorney, Agent, or Firm* — McKenna Long & Aldridge LLP

(57) ABSTRACT

An organic light emitting diode display device, comprises: a thin film transistor on a substrate; a first insulating layer on the thin film transistor; a connecting electrode connected to the thin film transistor and a first auxiliary electrode on the first insulating layer; a second insulating layer on the connecting electrode and the first auxiliary electrode; an anode connected to the connecting electrode and a second auxiliary electrode spaced apart from the anode and connected to the first auxiliary electrode on the second insulating layer; a bank layer having a first contact hole exposing the anode and a second contact hole exposing the second auxiliary electrode on the anode and the second auxiliary electrode; an organic emitting layer on the anode in the first contact hole; and a cathode electrically connected to the second auxiliary electrode on the organic emitting layer.

19 Claims, 4 Drawing Sheets

ORGANIC LIGHT EMITTING DIODE DISPLAY DEVICE AND METHOD OF FABRICATING THE SAME

CROSS-REFERENCE TO RELATED APPLICATIONS

The present application claims the benefit of priority of Korean Patent Application No. 10-2013-0044924 filed on Apr. 23, 2013, which is hereby incorporated by reference for all purposes as if fully set forth herein.

BACKGROUND OF THE INVENTION

1. Field of the Invention

The present disclosure relates to an organic light emitting diode display device. The present disclosure also relates to an active matrix organic light emitting diode display device and a method of fabricating the same.

2. Discussion of the Related Art

Although a cathode ray tube (CRT) has led the display device industry for several decades, the CRT has lost the lead in display devices by a flat panel display (FPD) due to a large volume and a heavy weight. In the display market, up to recently, the FPD has gained in popularity due to a light weight and a thin profile as compared with the CRT having a high resolution.

The FPD may include a liquid crystal display (LCD) device, a plasma display panel (PDP) device and an organic light emitting diode (OLED) display device. The LCD device has attracted wide attention and the OLED display device is getting the spotlight as a next generation FPD posterior to the LCD device. Specifically, the OLED display device has an emissive type to obtain a light weight and a thin profile as compared with the LCD device having a non-emissive type using a backlight unit.

The OLED display device may be classified into a top emission type and a bottom emission type. A light from an organic emitting layer is emitted through a cathode in the top emission type OLED display device and is emitted through an anode in a bottom emission type OLED display device. In the top emission type OLED display device, since the light is emitted through the cathode, a thin profile may be obtained. However, the cathode may have a high resistance.

In general, the OLED display device may include a substrate, a thin film transistor (TFT), a planarization layer, an anode, a bank layer, an organic emitting layer and a cathode. The TFT is formed on the substrate and the planarization layer is formed on the TFT. The anode is formed on the planarization layer and is connected to the TFT. The TFT transmits a source voltage according to a data signal to the anode and a current according to the source voltage is supplied to the anode.

The bank layer exposing a portion of the anode is formed on the anode and the organic emitting layer is formed on the bank layer and the exposed portion of the anode. The cathode is formed on the organic emitting layer. The organic emitting layer contacting the anode and the cathode emits a light.

In the top emission type OLED display device, since the light from the organic emitting layer is emitted through the cathode, the cathode should be formed to have a relatively small thickness. However, the thin cathode slows down a flow of a current due to a high resistance and causes non-uniformity in brightness. Accordingly, the cathode is required to have a relatively low resistance for a normal operation.

SUMMARY OF THE INVENTION

Accordingly, the present invention is directed to an organic light emitting diode display and a method of fabricating the same that substantially obviate one or more of the problems due to limitations and disadvantages of the related art.

An organic light emitting diode display device, comprises: a thin film transistor on a substrate; a first insulating layer on the thin film transistor; a connecting electrode and a first auxiliary electrode on the first insulating layer, the connecting electrode connected to the thin film transistor; a second insulating layer on the connecting electrode and the first auxiliary electrode; an anode and a second auxiliary electrode on the second insulating layer, the anode connected to the connecting electrode, and the second auxiliary electrode spaced apart from the anode and connected to the first auxiliary electrode; a bank layer on the anode and the second auxiliary electrode, the bank layer having a first contact hole exposing the anode and a second contact hole exposing the second auxiliary electrode; an organic emitting layer on the anode in the first contact hole; and a cathode on the organic emitting layer, the cathode electrically connected to the second auxiliary electrode.

In another aspect, a method of fabricating an organic light emitting diode display device, comprises: forming a thin film transistor on a substrate; forming a first insulating layer on the thin film transistor; forming a connecting electrode and a first auxiliary electrode on the first insulating layer, the connecting electrode connected to the thin film transistor; forming a second insulating layer on the connecting electrode and the first auxiliary electrode; forming an anode and a second auxiliary electrode on the second insulating layer, the anode connected to the connecting electrode, and the second auxiliary electrode spaced apart from the anode and connected to the first auxiliary electrode; forming a bank layer on the anode and the second auxiliary electrode, the bank layer having a first contact hole exposing the anode and a second contact hole exposing the second auxiliary electrode; forming an organic emitting layer on the anode in the first contact hole; and forming a cathode on the organic emitting layer, the cathode electrically connected to the second auxiliary electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
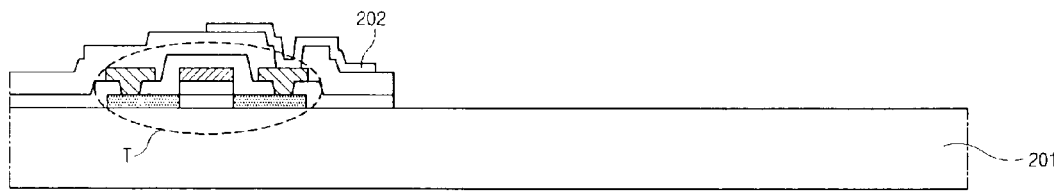
FIGS. 1 to 8 are cross-sectional views showing a method of fabricating an organic light emitting diode display device according to an embodiment of the present invention.

Reference will now be made in detail to the preferred embodiments, examples of which are illustrated in the accompanying drawings.

FIGS. 1 to 8 are cross-sectional views showing a method of fabricating an organic light emitting diode display device according to an embodiment of the present invention.

In FIGS. 1 to 8, an organic light emitting diode (OLED) display device according to an embodiment of the present invention includes a substrate 201, a thin film transistor (TFT)

T, a first insulating layer 210, a connecting electrode 211, a first auxiliary electrode 212, a second insulating layer 220, an anode 230, a second auxiliary electrode 231, a bank layer 240, a separator 250, an organic emitting layer 260 and a cathode 270.

The substrate 201 may include one of a glass, a metal and a flexible material. The flexible material may include a plastic and a material having excellent thermal resistance and durability may be used as the flexible material. For example, the substrate 201 may include one of polyethersulfone (PES), polyacrylate (PAR), polyetherimide (PEI), polyethylenenapthalate (PEN) and polyethyleneterepthalate (PET).

In FIG. 1, the TFT T is formed on the substrate 201. The TFT T transmits a source voltage due to a data signal to the anode 220 through the transmitting electrode 202 and the connecting electrode 211. Although not shown, a capacitor electrode having the same layer as the transmitting electrode 202 may be formed to constitute a storage capacitor. The transmitting electrode 202 may be omitted in another embodiment.

Figure 2:
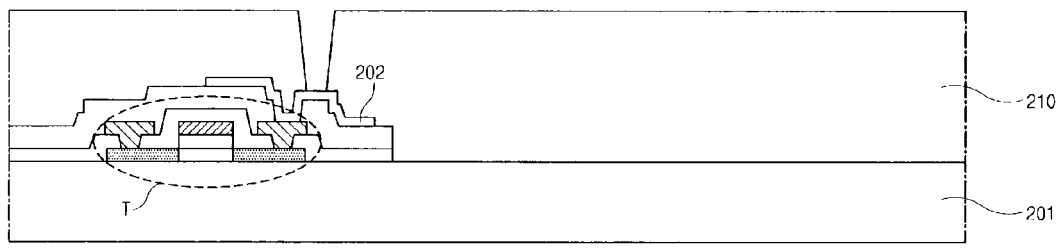

In FIG. 2, the first insulating layer 210 is formed on the TFT T. For example, the first insulating layer 210 may expose a portion of the TFT T. The first insulating layer 210 may function as a planarization layer planarizing an unevenness of the TFT T to have a flat top surface and to improve a structural stability of a light emitting diode thereon. For example, the first insulating layer 210 may include an organic material such as photo acrylic material. A passivation layer of an inorganic insulating material such as silicon oxide (SiOx) or silicon nitride (SiNx) may be formed between the TFT T and the first insulating layer 210 in another embodiment.

Figure 3:
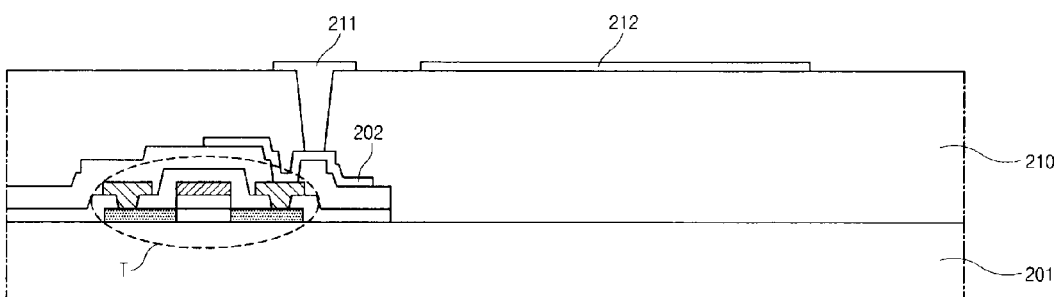

In FIG. 3, the connecting electrode 211 and the first auxiliary electrode 212 are formed on the first insulating layer 210. The connecting electrode 211 is connected to the TFT T to connect the TFT T and the anode 230. The first auxiliary electrode 212 is spaced apart from the connecting electrode 211 and is connected to the second auxiliary electrode 231 and the cathode 270 to reduce a resistance of the cathode 270.

Specifically, the first auxiliary electrode 212 may be formed in a region on the first insulating layer 210 except a region for the connecting electrode 211 with various thicknesses. Accordingly, the first auxiliary electrode 212 has an advantage of a high degree of freedom in design. The effects of the first auxiliary electrode 212 will be illustrated again.

The connecting electrode 212 and the first auxiliary electrode 212 may have the same material and the same layer as each other. In addition, the connecting electrode 212 and the first auxiliary electrode 212 may be formed through the same fabrication process to improve an efficiency of fabrication.

Figure 4:
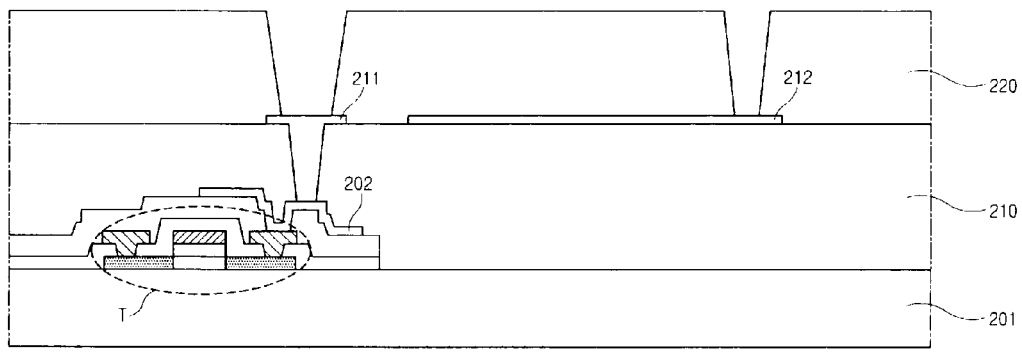

In FIG. 4, the second insulating layer 220 is formed on the first insulating layer 210, the connecting electrode 211 and the first auxiliary electrode 212. For example, the second insulating layer 220 may expose a portion of the connecting electrode 211 and a portion of the first auxiliary electrode 212. The second insulating layer 220 may include an organic material such as photo acrylic material to function as a planarization layer planarizing an unevenness of the connecting electrode 211 and the first auxiliary electrode 212 and having a flat top surface.

Figure 5:
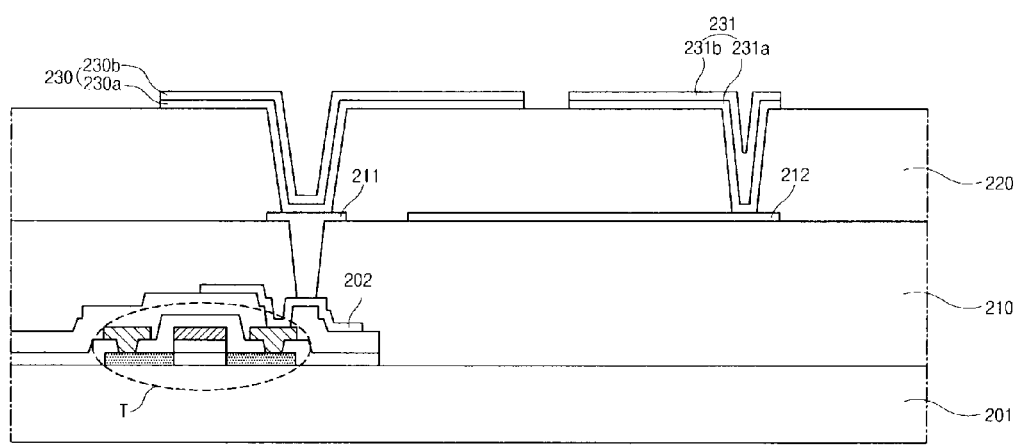

In FIG. 5, the anode 230 is formed on the second insulating layer 220. For example, the anode may be connected to the connecting electrode 211. The anode 230 may receive the source voltage due to the data signal from the TFT T through the connecting electrode 211 and may supply a hole to the organic emitting layer 260.

The anode 230 may have a double-layered structure including an anode metal layer 230a and an anode conductive oxide layer 230b. The anode conductive oxide layer 230b may be formed on the anode metal layer 230a and may contact the organic emitting layer 260. For example, the anode metal layer 230a may be formed on the second insulating layer 220 and the anode conductive oxide layer 230b may be formed on the anode metal layer 230a.

The anode metal layer 230a may improve an electrical conductivity of the anode 230 and may include one of silver (Ag), aluminum (Al), neodymium (Nd), copper (Cu) and molybdenum (Mo). When a micro cavity structure is applied to the anode metal layer 230a, the anode metal layer 230a may have a high reflectance to function as a reflecting layer.

The anode conductive oxide layer 230b may have a relatively high work function to supply a hole to the organic emitting layer 260 and may include a transparent conductive oxide material such as indium-tin-oxide (ITO), indium-zinc-oxide (IZO) and indium-tin-zinc-oxide (ITZO). The anode metal layer 230a may be omitted so that the anode 230 can have a single-layered structure including a conductive oxide layer in another embodiment.

In addition, the second auxiliary electrode 231 is formed on the second insulating layer 220. The second auxiliary electrode 231 may be spaced apart from the anode 230 and may be connected to the first auxiliary electrode 212 and the cathode 270 to reduce a resistance of the cathode 270.

Similarly to the anode 230, the second auxiliary electrode 231 may have a double-layered structure including an auxiliary metal layer 231a and an auxiliary conductive oxide layer 231b. Since a metal layer is more effective to reduce the resistance of the cathode 270 than a conductive oxide layer, the second auxiliary electrode 231 may have a single-layered structure including a metal layer which has the same material and the same layer as the anode metal layer 230a of the anode 230 in another embodiment. In addition, when the anode 230 has a single-layered structure including a conductive oxide layer, the second auxiliary electrode 231 may have a single-layered structure including a conductive oxide layer. Accordingly, the second auxiliary electrode 231 may include at least one of a metal layer and a conductive oxide layer.

The anode 230 and the second auxiliary electrode 231 may have the same material and the same layer as each other. In addition, the anode 230 and the second auxiliary electrode 231 may be formed through the same fabrication process to improve an efficiency of fabrication.

In the OLED display device according to the first embodiment of the present invention, the first and second auxiliary electrodes 212 and 231 may be connected to the cathode 270 to reduce a resistance of the cathode 270. In addition, since double layers of the first and second auxiliary electrodes 212 and 231 effectively reduce the resistance of the cathode 270, uniformity in brightness of the OLED display device is improved.

Figure 6:
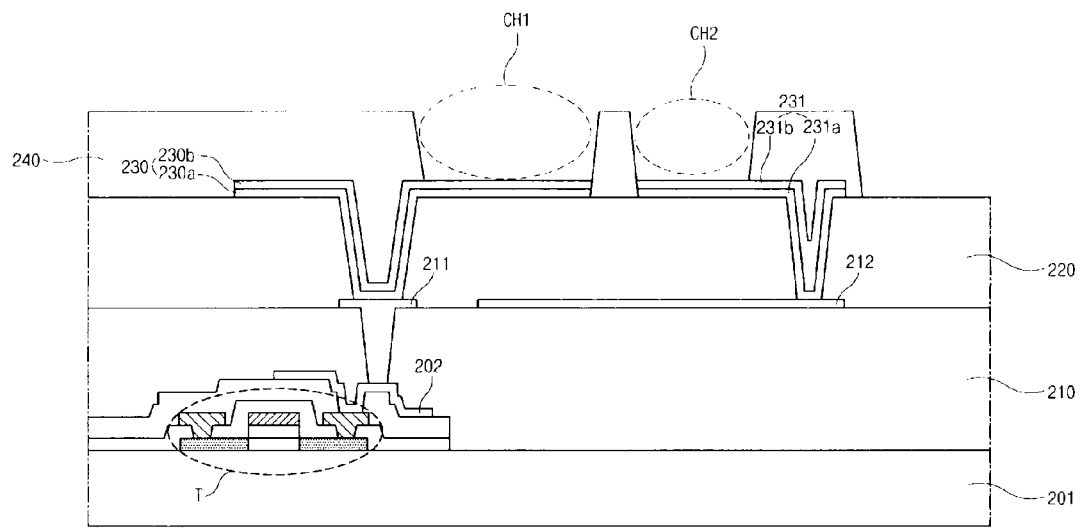

In FIG. 6, the bank layer 240 is formed on the anode 230 and the second auxiliary electrode 231. The bank layer 240 may have a first contact hole CH1 exposing a portion of the anode 230 and a second contact hole CH2 exposing a portion of the second auxiliary electrode 231. The bank layer 240 may include one of benzocyclobutene (BCB) resin, acrylic resin and polyimide resin.

The portion of the anode 230 exposed through the bank layer 240 may constitute a hole supplying region, i.e., a light emitting region. Accordingly, the organic emitting layer 260 in the hole supplying region which is not covered with and is exposed through the bank layer 240 emits a light by the anode 230 and the cathode 270.

Figure 7:
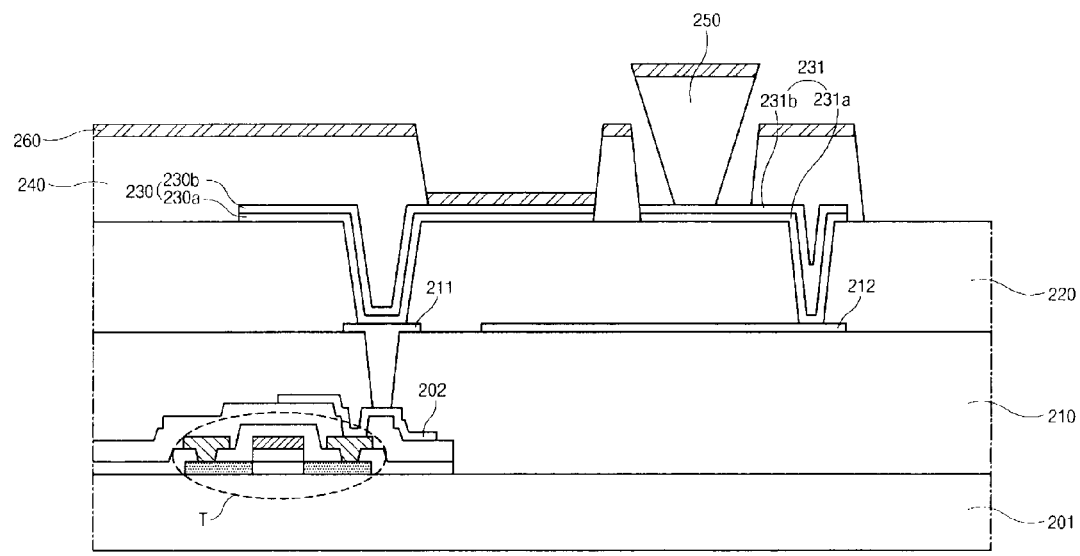

In FIG. 7, the separator 250 is formed on the second auxiliary electrode 231 in the second contact hole CH2. The separator 250 may be formed on the portion of the second auxiliary electrode 231 exposed by the second contact hole CH2 of the bank layer 240. The separator 250 may be spaced apart from the bank layer 240 in the second contact hole CH2, and the cathode 270 and the second auxiliary electrode 231 are electrically connected to each other at a gap region between the separator 250 and the bank layer 240 in the second contact hole CH2.

The separator 250 may have an inverted taper shape to prevent the organic emitting layer 260 from being formed on the second auxiliary electrode 231. When the organic emitting layer 260 is formed on the second auxiliary electrode 231, the cathode 270 cannot be electrically connected to the second auxiliary electrode 231. Accordingly, the organic emitting layer 260 is prevented from being formed on the second auxiliary electrode 231 by forming the separator 250 on the second auxiliary electrode 231 prior to forming the organic emitting layer 260. In a subsequent step of forming the cathode 270, since the cathode 270 has an excellent step coverage property, the cathode 270 may be electrically connected to the second auxiliary electrode 231 through the second contact hole CH2.

Although separator 250 is used for preventing the organic emitting layer 260 from being formed in the second contact hole CH2 to connect the cathode 270 and the second auxiliary electrode 231 in the first embodiment, various structures or various methods may be used for connecting the cathode 270 and the second auxiliary electrode 231 in another embodiment.

In addition, the organic emitting layer 260 may be formed on the bank layer 240 and the portion of the anode 230 exposed by the first contact hole CH1. Since the organic emitting layer 260 is formed on an entire surface of the substrate 201 having the separator 250, the organic emitting layer 260 may be formed on the bank layer, the separator 250 and the anode 230.

The organic emitting layer 260 may includes an organic material. Since the organic material has a poor step coverage property, the organic emitting layer 260 is not formed in the gap region between the separator 250 and the bank layer 240 in the second contact hole CH2. As a result, the organic emitting layer 260 may be formed to be cut away in the gap region.

The organic emitting layer 260 forms an exciton by combining a hole receiving from the anode 230 and an electron receiving from the cathode 270, and the exciton emits a light during a transition from an excited state to a ground state to display grey levels in each pixel.

In a red-green-blue (RGB) type where emitting layers for red, green and blue lights of three primary colors are independently formed, each of emitting layers emits a light of a wavelength corresponding to each color. In a white-red-green-blue (WRGB) type where emitting layers for white light are formed, each of emitting layers emits a white light and the white light is converted into a light having a predetermined color by a converting means such as a color filter. Accordingly, the light having the predetermined color is emitted from the OLED display device.

Figure 8:
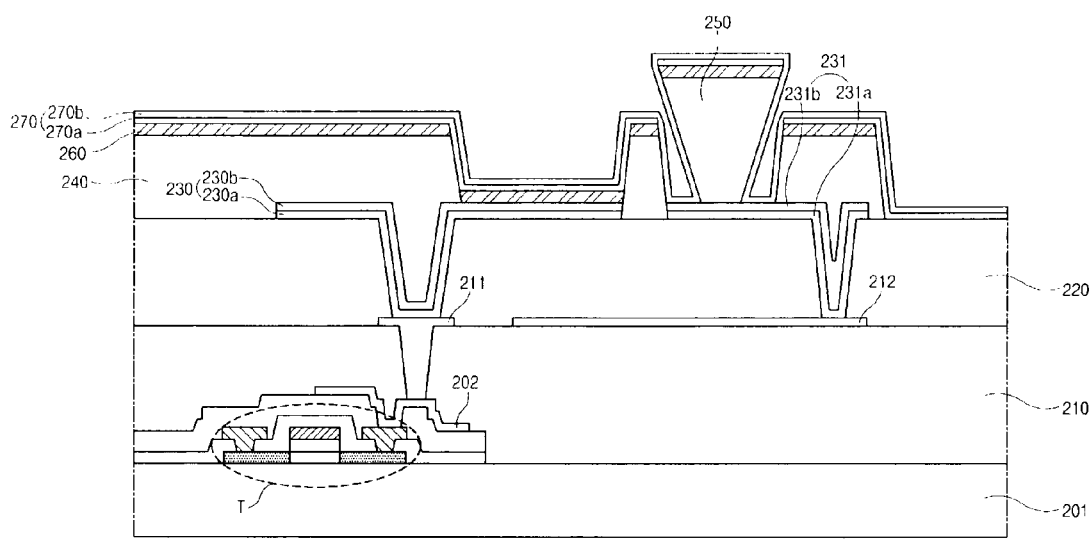

In FIG. 8, the cathode 270 is formed on the organic emitting layer 260. Specifically, the cathode 270 is formed in the gap region between the separator 250 and the bank layer 240 in the second contact hole CH2 to be electrically connected to the second auxiliary electrode 231.

The cathode 270 may have a double-layered structure including a cathode metal layer 270a and a cathode conductive oxide layer 270b. The cathode metal layer 270a may be formed on the organic emitting layer 260 and the cathode conductive oxide layer 270b may be formed on the cathode metal layer 270a.

The cathode metal layer 270a may have a relatively low work function to supply an electron to the organic emitting layer 260 and may include a metallic material such as silver (Ag), magnesium (Mg), calcium (Ca) and lithium (Li). When the OLED display device has a top emission type, the cathode metal layer 270a may include a translucent metallic material or a metallic material having a relatively small thickness so that a light can transmit the cathode metal layer 270a.

Similarly to the organic emitting layer 260, since the cathode metal layer 270a has a poor step coverage property, the cathode metal layer 270a may not be formed in the gap region between the separator 250 and the bank layer 240 in the second contact hole CH2 and may be formed to be cut away in the gap region.

The cathode conductive oxide layer 270b may include a material having an excellent step coverage property to be formed on the auxiliary conductive oxide layer 231b in the gap region between the separator 250 and the bank layer 240 in the second contact hole CH2. For example, the cathode conductive oxide layer 270b may include a transparent conductive oxide material such as indium-tin-oxide (ITO), indium-zinc-oxide (IZO) and indium-tin-zinc-oxide (ITZO). Accordingly, the cathode conductive oxide layer 270b may be formed on the cathode metal layer 270a, the bank layer 240, the separator 250 and the auxiliary conductive oxide layer 231b so that the cathode conductive oxide layer 270b of the cathode 270 can be connected to the auxiliary metal layer 231a of the second auxiliary electrode 231.

In addition, the cathode conductive oxide layer 270b may include a transparent material to improve transmittance of the cathode metal layer 270a. When a metallic material layer and a transparent material layer contact each other, the transmittance of the metallic material layer and the transparent material layer may be improved due to anti-reflection effect by destructive interference. Accordingly, the cathode conductive oxide layer 270b may connect the cathode 270 and the second auxiliary electrode 231 and may improve transmittance of the cathode 270.

Consequently, in the OLED display device according to the present disclosure, a resistance of a cathode is reduced by connecting the cathode with an auxiliary electrode. The resistance of the cathode is further reduced by forming the auxiliary electrode to have a double-layered structure. In addition, fabrication efficiency is improved by forming the auxiliary electrode together with an anode and a connecting electrode. Moreover, uniformity in brightness of a large-sized OLED display device is improved due to the cathode having a low resistance.

It will be apparent to those skilled in the art that various modifications and variations can be made in an organic light emitting diode display device and a method of fabricating the organic light emitting diode display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting diode display device, comprising:

a thin film transistor on a substrate;

a first insulating layer on the thin film transistor;

a connecting electrode and a first auxiliary electrode on the first insulating layer, the connecting electrode connected to the thin film transistor;

a second insulating layer on the connecting electrode and the first auxiliary electrode;

an anode and a second auxiliary electrode on the second insulating layer, the anode connected to the connecting electrode, and the second auxiliary electrode spaced apart from the anode and connected to the first auxiliary electrode;

a bank layer on the anode and the second auxiliary electrode, the bank layer having a first contact hole exposing the anode and a second contact hole exposing the second auxiliary electrode;

an organic emitting layer on the anode in the first contact hole; and a cathode on the organic emitting layer, the cathode electrically connected to the second auxiliary electrode, wherein the first auxiliary electrode is disposed directly under the organic emitting layer.

2. The display device according to claim 1, wherein the anode includes an anode metal layer and an anode conductive oxide layer on the anode metal layer, and wherein the anode conductive oxide layer contacts the organic emitting layer.

3. The display device according to claim 2, wherein the anode metal layer includes a reflecting layer and the anode conductive oxide layer includes a transparent layer.

4. The display device according to claim 1, wherein the cathode includes a cathode metal layer contacting the organic emitting layer and a cathode conductive oxide layer on the cathode metal layer, and wherein the cathode conductive oxide layer is electrically connected to the second auxiliary electrode in the second contact hole.

5. The display device according to claim 4, wherein the cathode conductive oxide layer includes a transparent layer.

6. The display device according to claim 1, wherein the connecting electrode and the first auxiliary electrode have a same material as each other.

7. The display device according to claim 1, wherein the anode and the second auxiliary electrode have a same material as each other.

8. The display device according to claim 1, wherein at least one of the first and second insulating layers include a planarization layer.

9. The display device according to claim 1, further comprising a separator on the second auxiliary electrode in the second contact hole, the separator spaced apart from the bank layer.

10. A method of fabricating an organic light emitting diode display device, comprising:

forming a thin film transistor on a substrate;

forming a first insulating layer on the thin film transistor;

forming a connecting electrode and a first auxiliary electrode on the first insulating layer, the connecting electrode connected to the thin film transistor;

forming a second insulating layer on the connecting electrode and the first auxiliary electrode;

forming an anode and a second auxiliary electrode on the second insulating layer, the anode connected to the connecting electrode, and the second auxiliary electrode spaced apart from the anode and connected to the first auxiliary electrode;

forming a bank layer on the anode and the second auxiliary electrode, the bank layer having a first contact hole exposing the anode and a second contact hole exposing the second auxiliary electrode;

forming an organic emitting layer on the anode in the first contact hole; and forming a cathode on the organic emitting layer, the cathode electrically connected to the second auxiliary electrode, wherein the first auxiliary electrode is disposed directly under the organic emitting layer.

11. The method according to claim 10, wherein the anode includes an anode metal layer and an anode conductive oxide layer on the anode metal layer, and wherein the anode conductive oxide layer contacts the organic emitting layer.

12. The method according to claim 11, wherein the anode metal layer includes a reflecting layer and the anode conductive oxide layer includes a transparent layer.

13. The method according to claim 10, wherein the cathode includes a cathode metal layer contacting the organic emitting layer and a cathode conductive oxide layer on the cathode metal layer, and wherein the cathode conductive oxide layer is electrically connected to the second auxiliary electrode in the second contact hole.

14. The method according to claim 13, wherein the cathode conductive oxide layer includes a transparent layer.

15. The method according to claim 10, wherein the connecting electrode and the first auxiliary electrode have a same material as each other.

16. The method according to claim 10, wherein the anode and the second auxiliary electrode have a same material as each other.

17. The method according to claim 10, wherein at least one of the first and second insulating layers include a planarization layer.

18. The method according to claim 10, further comprising forming a separator on the second auxiliary electrode in the second contact hole, the separator spaced apart from the bank layer.

19. The display device according to claim 6, further comprising a transmitting electrode on the thin film transistor, wherein the first insulating layer is disposed on the transmitting electrode, and wherein the connecting electrode is connected to the transmitting electrode.

* * * * *